United States Patent [19]
Ota

[11] Patent Number: 5,666,308
[45] Date of Patent: Sep. 9, 1997

[54] WRITING CIRCUIT FOR NON-VOLATILE MEMORY

[75] Inventor: Kazunori Ota, Tochigi-ken, Japan

[73] Assignee: Nippon Precision Circuits Inc., Tokyo, Japan

[21] Appl. No.: 668,785

[22] Filed: Jun. 24, 1996

[30] Foreign Application Priority Data

Jun. 28, 1995 [JP] Japan .................... 7-162199

[51] Int. Cl.$^6$ .................................................. B11C 11/34
[52] U.S. Cl. ...................... 365/185.05; 365/185.14; 365/185.24; 365/185.23
[58] Field of Search ............... 365/185.05, 185.14, 365/185.23, 185.24

[56] References Cited

U.S. PATENT DOCUMENTS 5,333,122  7/1994  Ninomiya ........................ 365/185.23
5,392,236  2/1995  Hashimoto ....................... 365/185.23

Primary Examiner—David C. Nelms
Assistant Examiner—F. Niranjan
Attorney, Agent, or Firm—Jordan and Hamburg

[57] ABSTRACT

A writing circuit for non-volatile memory capable of preventing the structure of the circuit from becoming complicated in an integrated circuit from the points of view of logic and layout by reducing the number of kinds of control signal voltages. The circuit includes a first NMOS transistor N1, a first PMOS transistor P1, a second NMOS transistor N2 which serves as a non-volatile memory write terminal and a depression type MOS transistor D1 having a source to which a control signal PGM for controlling the output condition of the above-mentioned write terminal is applied.

3 Claims, 3 Drawing Sheets

WRITING CIRCUIT FOR NON-VOLATILE MEMORY

BACKGROUND OF THE INVENTION

1. Field of Industry

The present invention relates to a writing circuit for a non-volatile memory such as a EPROM, EEPROM or flash memory.

2. Prior Art

FIG. 3 shows an example of a conventional writing circuit for non-volatile memory. Where a writing operation is performed on a memory transistor M10, the voltage of a control signal PGM is zero and the voltage of a control signal Vhv is 15 V. Since the power source voltage Vpp is 12 V, a NMOS transistor N11 is ON, a NMOS transistor N12 is OFF and a NMOS transistor N13 is ON. When a high-tension voltage is applied between terminals X and Y by address selection, the high-tension voltage is applied on the drain of the memory transistor M10 allowing a writing operation on the memory transistor M10 to be performed.

In the above-described conventional example, while the logical value "1" of the control signal PGM is 3 volts, that of the control signal Vhv is 15 volts. Accordingly, there has been a problem that two kinds of signal line voltages of 3 and 15 volts are necessary of voltages resulting in making the structure of the writing circuit in an integrated circuit complicated form the points of view of logic and layout.

SUMMARY OF THE INVENTION

Accordingly, the object of the present invention is to provide a writing circuit for non-volatile memory which is capable of preventing the structure of the circuit in an integrated circuit from becoming complicated from the points of view of both logic and layout by reducing the number of kinds of control signal voltages.

The writing circuit for non-volatile memory according to the present invention comprises: a first NMOS transistor having a gate connected to a first node, a source connected to ground and a drain connected to a second node; a first PMOS transistor having a gate connected to a first node, a source connected to a third node which is in turn connected to a power source and a drain connected to the second node; a second NMOS transistor having a gate connected to the first node, a source connected to a fourth node serving as a write terminal to the non-volatile memory and a drain connected to the third node; a second PMOS transistor having a gate connected to the second node, a source connected to the third node and a drain connected to the first node; and a depression type MOS transistor having a source to which a control signal for controlling the output condition of the above-mentioned non-volatile memory write terminal is applied and a drain connected to the first node.

DETAILED DESCRIPTION OF THE INVENTION

Figure 1:
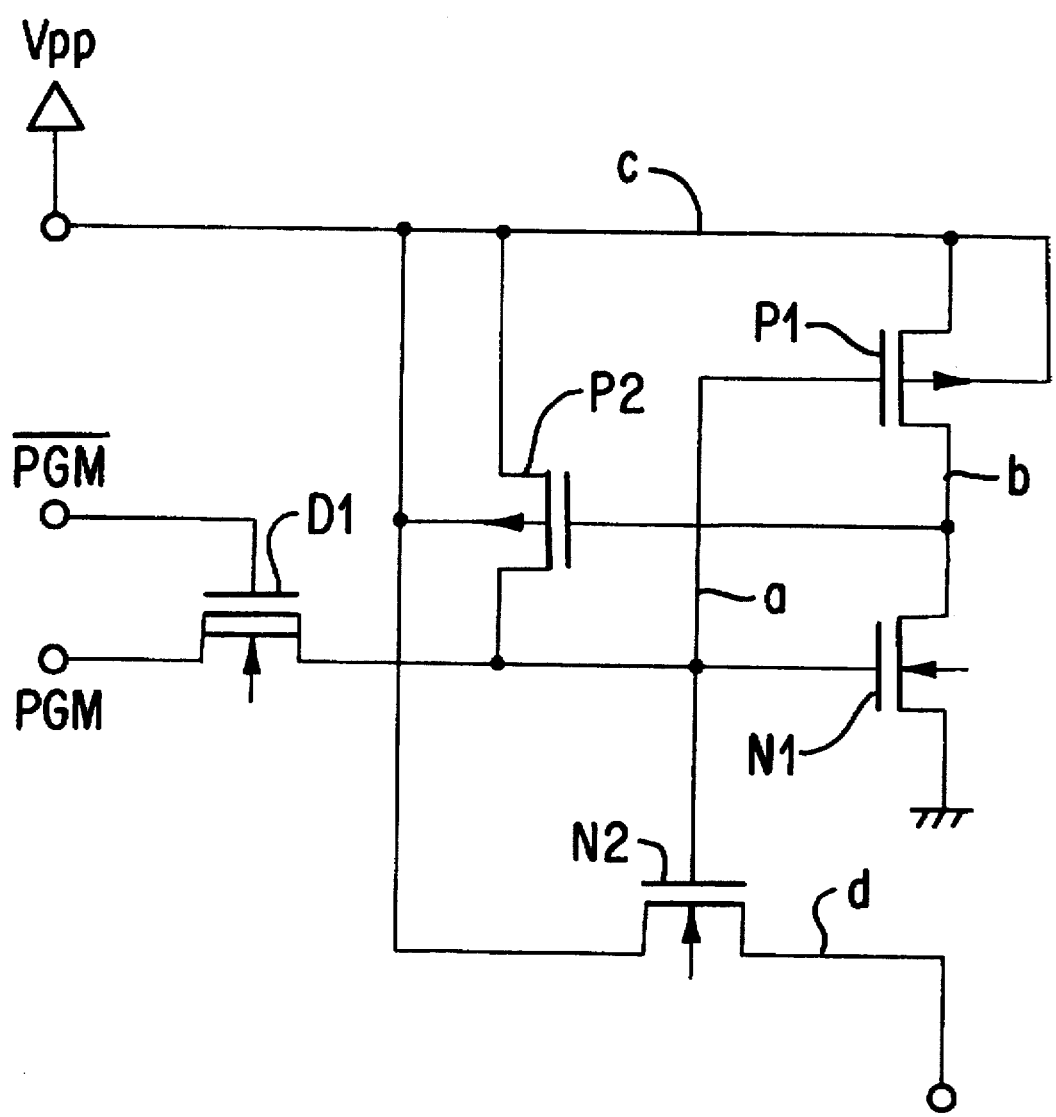
FIG. 1 is a diagram showing a writing circuit for non-volatile memory according to one embodiment of the present invention.

FIG. 1 is a diagram showing the structure of a writing circuit for non-volatile memory according to one embodiment of the present invention.

Reference symbols N1 and N2 designate first and second NMOS transistors, reference symbols P1 and P2 designate first and second PMOS transistors. Reference symbols a to d designate first to fourth nodes, respectively. Reference symbol D1 designates a depression type NMOS transistor. Reference symbol PGM designates a write control signal with respect to the non-volatile memory (not shown). The write control signal is so set that when the logical value of the signal is "1", the voltage thereof is 3 volts and when the logical value of the signal is "0", the voltage thereof is Note that the power source voltage Vpp is set to 12 volts.

The operation of the writing circuit shown in FIG. 1 will be described.

First, the operation of the circuit when the write control signal PGM takes logical value "1", i.e., 3 volts will be described. In this case, the write control signal PGM is applied to the gate of the first NMOS transistor N1 through the depression type NMOS transistor (which functions as a resistor) to turn the first NMOS transistor ON. As a result, the second PMOS transistor P2 goes ON and the gate of the second NMOS transistor N2 is pulled up to turn the second NMOS transistor N2 ON so that a high-tension voltage corresponding to the power source voltage Vpp is outputted from the source of the second NMOS transistor N2. Accordingly, by making the source of the second NMOS transistor N2 serve as the write terminal to the non-volatile memory, the writing in the non-volatile memory is enable&

Next, the operation of the writing circuit when the write control signal PGM has a logical value of "0", i.e., a voltage of "0", will be described. In this case, the write control signal PGM is applied to the gate of the first PMOS transistor P1 through the depression type NMOS transistor so that the first PMOS transistor P1 is turned ON. As a result, the second PMOS transistor P2 is mined ON so that the voltage applied to the gate of the second NMOS transistor N2 remains to be zero. Accordingly, the second NMOS transistor N2 goes OFF and the writing in the non-volatile memory is inhibited.

Figure 2:
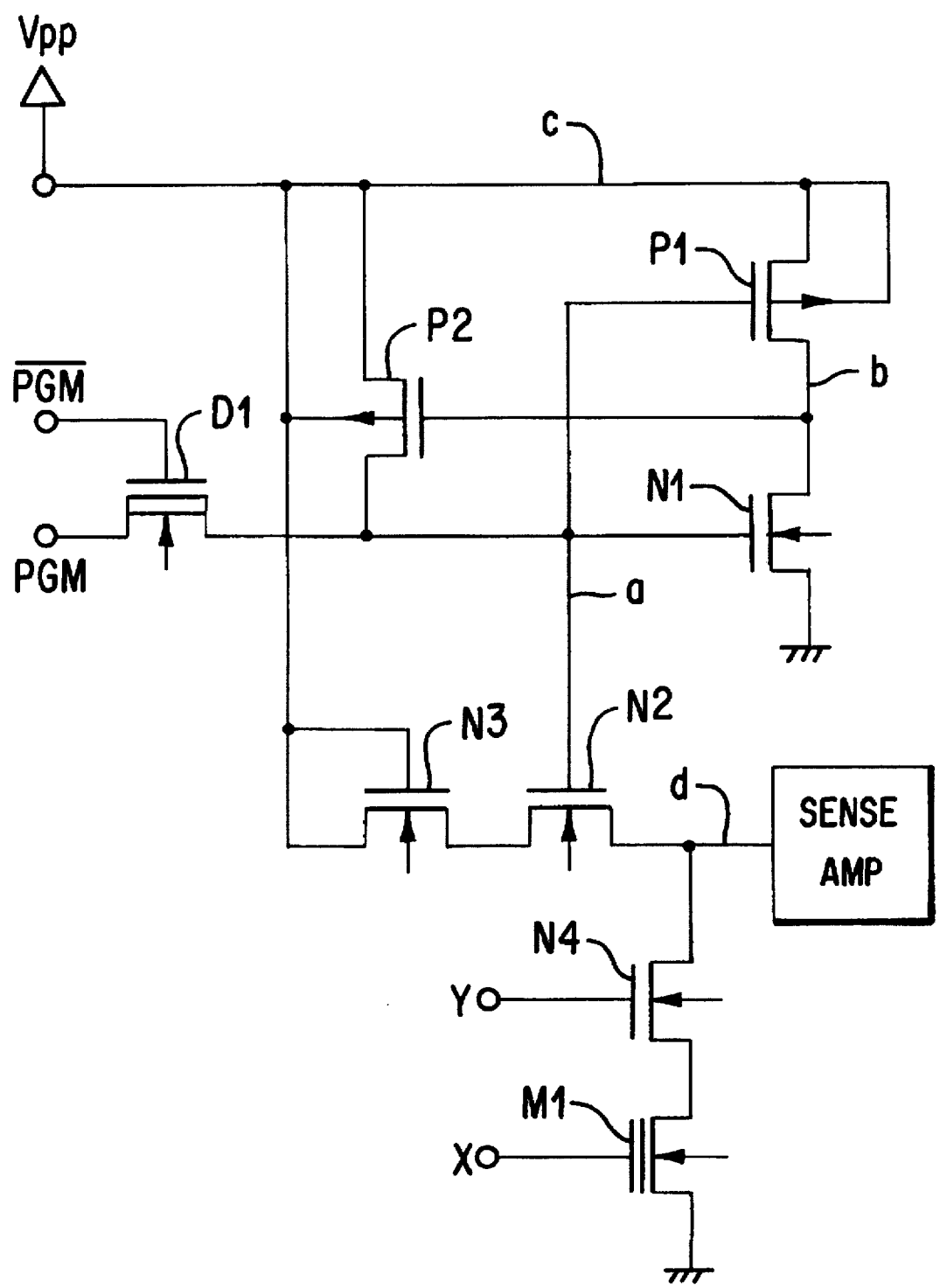
FIG. 2 is a diagram showing a writing circuit for non-volatile memory according to another embodiment of fie present invention wherein the circuit is connected to a non-volatile memory section of the non- volatile memory.
Figure 3:
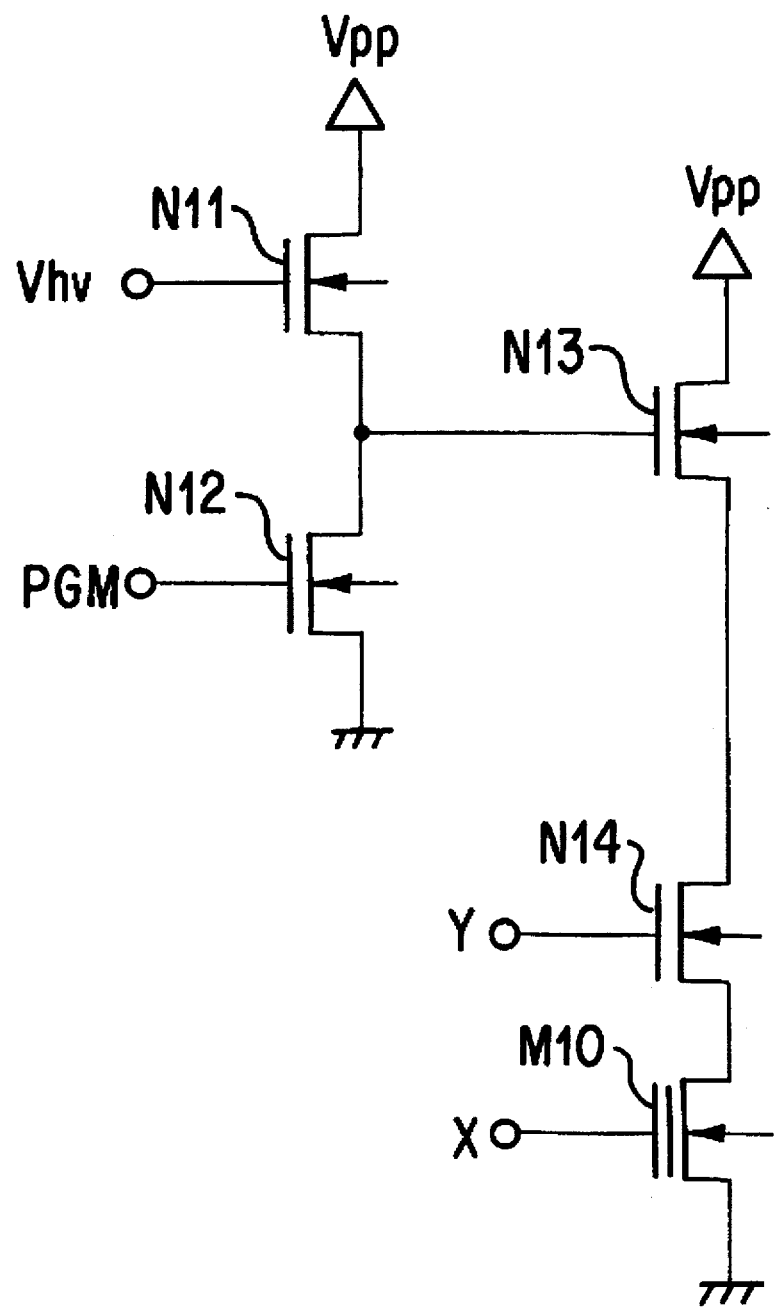
FIG. 3 is a diagram showing a conventional writing circuit for non-volatile memory.

FIG. 2 is a diagram showing a writing circuit for non-volatile memory connected to a non-volatile memory section of the memory according to another embodiment of the present invention.

The basic configuration of the writing circuit shown in FIG. 2 is quite similar to the embodiment shown in FIG. 1, wherein like parts are designated by like reference symbols. In the instant embodiment, the drain of a second NMOS transistor N2 is connected to a power source through a third NMOS transistor N3 having its gate and drain connected in common. In this point, this circuit differs from the writing circuit shown in FIG. 1.

The basic operation of the writing circuit in the instant embodiment is the same as that of the writing circuit in FIG. 1. That is, when the write control signal PGM takes a logical value of "1", i.e., 3 volts, the writing in the non-volatile memory transistor M1 is enabled. In this case, the power source voltage Vpp (12 volts) is dropped to some degree through the third. NMOS transistor N3 and the second NMOS transistor N2 and a voltage of about 8–9 volts is outputted from the source of the second NMOS transistor N2. In this state, when a selected voltage (power source voltage Vpp=12 volts) is applied to the terminals X and Y, a voltage dropped to about 6-7 volts through a NMOS transistor 4 is applied to the drain of the memory transistor thereby allowing a writing operation on the memory transistor M1 is performed. When the write control signal PGM takes a logical value "0", i.e., zero volt, the writing operation on the memory transistor M1 is inhibited as in the case of the embodiment shown in FIG. 1.

According to the writing circuit for non-volatile memory, the number of kinds of control signal voltages can be reduced so that it is possible to prevent the structure of the circuit in an integrated circuit from becoming complicated in view of both logic and layout of the writing circuit.

What is claimed is:

1. A writing circuit for non-volatile memory comprising:

a first NMOS transistor having a gate connected to a first node, a source connected to ground and a drain connected to a second node;

a first PMOS transistor having a gate connected to the first node, a source connected to a third node connected to a power source and a drain connected to the second node;

a second NMOS transistor having a gate connected to the first node, a source connected to a fourth node which serves as a write terminal to the non-volatile memory;

a second PMOS transistor having a gate connected to the second node, a source connected to the third node and a drain connected to the first node; and a depression type MOS transistor having a source to which a control signal for controlling the output condition of the volatile memory write terminal is applied, a gate to which a signal obtained as a result of inverting said control signal is applied and a drain connected to the first node.

2. A writing circuit far non-volatile memory according to claim 1, wherein the drain of said second NMOS transistor is connected directly to said third node.

3. A writing circuit for non-volatile memory according to claim 1, wherein the drain of said second NMOS transistor is connected to the third node through a third NMOS transistor having its gate and drain directly connected to the third node.

* * * * *